United States Patent
Bolz

(10) Patent No.: US 8,061,333 B2
(45) Date of Patent: Nov. 22, 2011

(54) CIRCUIT ARRANGEMENT AND METHOD FOR OPERATING AN INDUCTIVE LOAD

(75) Inventor: Stephan Bolz, Pfatter (DE)

(73) Assignee: Continental Automotive GmbH, Hannover (DE)

( * ) Notice: Subject to any disclaimer, the term of this patent is extended or adjusted under 35 U.S.C. 154(b) by 222 days.

(21) Appl. No.: 12/526,355

(22) PCT Filed: Jan. 28, 2008

(86) PCT No.: PCT/EP2008/050982
§ 371 (c)(1),
(2), (4) Date: Oct. 26, 2009

(87) PCT Pub. No.: WO2008/095818
PCT Pub. Date: Aug. 14, 2008

(65) Prior Publication Data
US 2010/0043757 A1    Feb. 25, 2010

(30) Foreign Application Priority Data
Feb. 7, 2007   (DE) .......................... 10 2007 006 179

(51) Int. Cl.
*F02M 51/00* (2006.01)
(52) U.S. Cl. ........................................... 123/476
(58) Field of Classification Search ............. 123/472, 123/476, 478, 482, 490; 239/585.1; 324/389; 323/282, 290
See application file for complete search history.

(56) References Cited

U.S. PATENT DOCUMENTS

| 5,711,280 A | 1/1998 | Foerster et al. |
| 5,717,562 A | 2/1998 | Antone et al. |
| 5,796,223 A | 8/1998 | Ohtsuka et al. |
| 6,772,737 B2 | 8/2004 | Gaessler et al. |
| 2008/0197904 A1 | 8/2008 | Bolz |

FOREIGN PATENT DOCUMENTS

| DE | 3920064 A1 | 1/1991 |
| DE | 4024496 A1 | 2/1992 |
| DE | 19533131 A1 | 3/1997 |
| DE | 19728221 A1 | 1/1998 |
| DE | 10057778 A1 | 10/2001 |
| JP | 2000028027 A | 1/2000 |
| JP | 2001012285 A | 1/2001 |
| JP | 2001015332 A | 1/2001 |
| WO | 2006134009 A1 | 12/2006 |

OTHER PUBLICATIONS

German Office Action dated Jul. 30, 2007.

*Primary Examiner* — Hai Huynh
(74) *Attorney, Agent, or Firm* — Laurence A. Greenberg; Werner H. Stemer; Ralph E. Locher

(57) ABSTRACT

A circuit and a method for operating an inductive load, for example a fuel injector, in which rapid response of the load can be realized and, at the same time, small electrical power loss. A functional isolation of the rapid current buildup at the beginning of an energizing phase and a subsequent setting of the load current is provided, wherein the supply to the load takes place during the first operating phase from a "boost voltage" and during the second operating phase from the comparatively lower second operating voltage. In the second operating phase, a desired load current is set by suitably switching the second operating voltage on an off at the load. This intermittent operation causes lower switching losses, which are yet further reduced by the second operating voltage being matched, i.e. not being fixedly predetermined but being changed if necessary on the basis of monitoring of the load current.

10 Claims, 9 Drawing Sheets

CIRCUIT ARRANGEMENT AND METHOD FOR OPERATING AN INDUCTIVE LOAD

BACKGROUND OF THE INVENTION

Field of the Invention

The invention relates to a circuit arrangement for operating an inductive load, in particular a magnetic valve of a fuel injection system of an internal combustion engine.

With regard to the operation of an inductive load it is often desirable to be able to set or change a current flowing through the load, referred to in the following as load current, as rapidly and precisely as possible. If the inductive load in question is for example a magnetic valve of a fuel injection system of an internal combustion engine, then it is possible to achieve an improvement in the performance characteristics of the internal combustion engine by rapidly switching on, precisely setting and rapidly switching off the load current. In particular the exhaust emission standards, which have become stricter in recent times, for internal combustion engines in the motor vehicle industry require as rapid and delay-free a response as possible from the injection valves in question in the event that electromagnetic injection valves are used.

To provide a better understanding of the invention described below, a fundamental problem arising during operation of an inductive load will first be explained with reference to FIGS. 1 and 2.

FIG. 1 shows a circuit arrangement for operating an inductive load L1 by energizing the latter from a voltage source (operating voltage V+).

With regard to the circuit arrangement illustrated, the inductive load L1 can be connected by way of two switching transistors T1 and T2 in the manner illustrated to the operating voltage V+. A rapid current buildup during switch-on of the load current is possible only with an "increased" operating voltage V+ on account of the inductive character of the load L1. This should mean that the value of the operating voltage V+ is appreciably greater than a voltage value which would be sufficient in the stationary state (constant load current) to drive a maximum desired load current through the load L1 in an energizing phase. Within the scope of the invention described below, such an increased operating voltage is also referred to as "first operating voltage" or "boost voltage".

In order to set a load current desired for the energizing phase after switch-on of the load current, the load current can be regulated to a predefined current value by the illustrated circuit arrangement by means of PWM operation (pulse width modulation).

An energizing phase, wherein initially the load current is switched on, then is set to a desired load current and is finally switched off again, can be implemented as follows with the illustrated circuit arrangement:

At the start of the switch-on process the transistors T1 and T2 are closed. The operating voltage V+ is now present at the load L1 and the load current rises rapidly. FIG. 2 shows the waveforms of a load voltage VL present at the load L1 and of the load current IL flowing through the load as a function of the time t. The load current IL is measured by means of a measuring facility (not shown) which is connected to a control facility (likewise not shown) for driving the transistors T1 and T2. When an upper current limit (upper current setpoint value) is attained, T1 is switched off and the load current IL now flows again through a freewheeling diode D1 and the transistor T2, falling slowly. When the load current IL now attains a lower current limit (lower current setpoint value), then T1 is switched on again, whereupon the load current rises once again. By switching T1 on and off repeatedly (on-off control, for example), the load current can thus be kept to an approximately constant value for the duration of the energizing phase. At the end of the energizing phase the transistors T1 and T2 are switched off simultaneously and the load current IL is fed back by way of the freewheeling diode D1 and a recuperation diode D2 into the supply (voltage source).

As already mentioned, the inductive load L1 in question can for example be a magnetic valve of a fuel injection system, for example for a high-pressure direct injection system for diesel or petrol (pump nozzle, HPDI etc.). Other applications could be, for example: 3-phase frequency converter for operating electric motors or generators using electronic commutation (ISG), bidirectional DC/DC converter (for example 14 V/42 V, ISG), electromagnetic valve train (IVT) etc.

In particular for operating voltages V+ of less than 200 V, MOS power transistors can advantageously be used as switching transistors T1 and T2, preferably N-channel types for cost-saving reasons.

The circuit arrangement illustrated in FIG. 1 does however have a number of disadvantages such as for example a comparatively poor level of efficiency because the increased operating voltage V+ in practice often needs to be generated initially by means of a DC/DC converter, a switching regulator for example, from a base voltage, a battery voltage for example (12 V in the case of a motor vehicle, for example) and a high voltage and a high current are present at the same time at the switching transistor T1 during the switching processes. Relatively large switching losses thus result. Although these switching losses or the accompanying high instantaneous power at the switching transistor T1 can be reduced somewhat by providing very short switching times, this does however disadvantageously increase the EMC radiation of the circuit considerably. In the automobile sector, even with additional, expensive measures such as screening a wiring harness toward the inductive load (injection valve for example) the limit values required in practice in respect of the EMC can only be adhered to with difficulty. In order to provide the increased operating voltage V+ from a vehicle electrical system voltage of 12 V for example, typical in the automobile sector, a high-performance costly switching regulator is required, which must deliver the entire power for operating the load in question.

BRIEF SUMMARY OF THE INVENTION

An object of the present invention is to provide a circuit arrangement and also a method for operating an inductive load, in particular a magnetic valve of a fuel injection system of an internal combustion engine, wherein the disadvantages described above can be lessened and in particular a rapid response by the load can be implemented whilst at the same time experiencing low electrical power loss.

This object is achieved according to the invention by a circuit arrangement as claimed in claim 1 and an operating method as claimed in claim 8. The dependent claims relate to advantageous developments of the invention.

The circuit arrangement according to the invention comprises:

energizing means for energizing the load, which are designed so as to apply a first operating voltage at the load during a first operating phase and, during a subsequent second operating phase, to apply a second operating voltage, which is smaller than the first operating voltage, in intermittent fashion at the load, setting means for controlling the intermittent operation of the energizing means during the second operating phase in order to set a desired load current by suitably switching on and switching off the second operating voltage at the load, monitoring means for monitoring the attainment of the desired load current during the second operating phase, and adjustment means for adjusting the second operating voltage on the basis of the result of the monitoring.

A first basic concept of the invention consists in providing a functional separation of rapid current buildup at the beginning of an energizing phase ("first operating phase") and subsequent load current setting ("second operating phase"), wherein the supply to the load during the first operating phase is effected from an "increased supply voltage" and during the subsequent second operating phase from a "normal supply voltage" ("double voltage supply").

During the second operating phase the desired load current is set by suitably switching the second operating voltage on and off at the load. In practice, this intermittent operation causes switching losses of greater or lesser magnitude. A second basic concept of the invention consists in further reducing these switching losses (already reduced in any case by virtue of the relatively low second operating voltage) by adjusting the second operating voltage, in other words this is not permanently predefined but is changed where necessary on the basis of monitoring the load current. A decisive advantage of adjusting (changing) the second operating voltage consists in the fact that in practice such an adjustment does not cause any additional appreciable losses and can quite considerably further reduce the switching losses occurring in the second operating phase.

Two effects can be utilized for reducing the switching losses through adjustment of the second operating voltage. On the one hand, it is possible through the adjustment to ensure that the value of the second operating voltage is always only as great as, or slightly greater than, is actually required (in order to drive the desired load current through the load in the switched-on state). The thus relatively low second operating voltage results in correspondingly smaller losses in the case of each switching process. On the other hand, a second operating voltage adjusted in this manner reduces the incidence, or frequency, of the switching processes brought about in order to set the desired load current. This effect too reduces the electrical losses in the second operating phase.

In a preferred embodiment, the energizing means comprise a switching transistor arrangement (MOS transistors, for example) for switching on and switching off the second operating voltage at the load.

In addition, the configuration of at least one freewheeling diode and/or at least one recuperation diode is preferred in order after a switch-off process to allow a freewheeling current to continue flowing or at the end of the energizing phase to accomplish a recovery of electrical energy into the electrical supply.

The first operating voltage advantageously increased for a rapid current buildup at the beginning of an energizing phase is, according to one embodiment, greater by at least a factor of 1.5 than the second operating voltage or than a nominal value for this second operating voltage.

In a preferred embodiment, PWM operation of the energizing means is provided during the second operating phase, wherein the setting means vary a PWM duty cycle in order to set, in particular regulate, the desired load current.

In a particularly simple embodiment in terms of circuit technology provision is made that the setting means provide an on-off control in such a manner that the second operating voltage is switched off as soon as the load current attains an upper current limit and the second operating voltage is switched on again as soon as the load current attains a lower current limit. A current measurement required for this purpose can for example be implemented by means of a current-sensing resistor (shunt) arranged in series with the inductive load. The upper current limit and the lower current limit can be predefined for example by the same amount above or below the value of the desired load current by a control facility, to which is also input a measurement signal representative of the actual load current.

The transition from the first operating phase to the second operating phase is preferably initiated on attaining an upper current limit, which in the simplest case is the upper current limit used at the beginning of the second operating phase. For simple applications, the desired load current in the second operating phase and accordingly the two current limits for setting the load current can be predefined in constant form. The fact should not however be excluded that the desired load current and accordingly the two current limits are varied during the duration of the second operating phase.

In a preferred embodiment, provision is made that the monitoring means determine the attainment of the desired load current by sensing at least one accompanying switch-off of the second operating voltage during the second operating phase.

If the circuit arrangement or the operating method for operating a plurality of inductive loads is provided and a common second operating voltage is used for these loads, then the monitoring means can be designed such that a monitoring result signal output by these means is representative of whether the desired load current is attained for all loads or whether the desired load current is not attained for at least one of the loads. This measure ("AND logical operation") forming part of the monitoring functionality ensures that the adjustment of the second operating voltage on the basis of the result of the monitoring brings about correct operation of all loads.

In a development of the invention, provision is made that the adjustment means bring about a constant change in the second operating voltage, wherein the sign of the change is predefined by the monitoring means. This measure means that a particularly need-based adjustment of the second operating voltage can be implemented. This is particularly advantageous in practice. For if the second operating voltage were to be dimensioned "generously" (high) over an extended period of time by the adjustment means, while this would ensure that the desired load current be reliably attained in the second operating phase, it would however increase switching losses unnecessarily at the same time. If on the other hand the adjustment were to dimension the second operating voltage "ungenerously" (low) over extended periods of time, then there would be a danger of the desired load current not being reliably attained in the second operating phase. By employing the aforementioned measure it is however advantageously possible in particular, for example, to implement an on-off control in such a manner that in the event of the monitoring means determining that the desired load current has been attained the second operating voltage is reduced, and in the event of the monitoring means determining that the desired load current has not been attained the second operating voltage is increased.

Such an on-off control serves to ensure to a certain extent that the second operating voltage "oscillates around an optimum". For many applications, it should however be borne in mind in this situation that each instance of the desired load current not being attained can be disadvantageous to a greater or lesser degree, or should not occur so frequently. Against this background, particularly advantageous in many application situations is a development according to which the reduction of the second operating voltage effected in the event of the desired load current being attained takes place considerably more slowly than the increase in the second operating voltage effected in the event of the desired load current not being attained. Corresponding reductions or increases, occurring essentially in linear fashion for example, in the second operating voltage can differ from one another for example by at least a factor of 2 in respect of the temporal rate of change.

In many application situations a particular advantage of the invention consists in the fact that aging-related changes in the electrical properties of the electrical components of the circuit arrangement, of the inductive load to be operated and of possible "wiring" (for example between a control unit and an injection system in a motor vehicle) can be compensated for within wide limits by means of the inventive setting of the desired load current in the second operating phase by regulating the desired load current in the second operating phase. An increase in resistive components of the load impedance or of an electrical connection arrangement between the circuit arrangement and the load or loads is then "regulated away". It is in practice nevertheless often desirable to determine or to diagnose such types of degradation in an electrical system. In a preferred development of the invention, in this respect further monitoring means are provided for monitoring the second operating voltage with regard to failure to attain a lower voltage limit and/or exceeding an upper voltage limit. In practice, in particular the monitoring with regard to exceeding an upper voltage limit is especially relevant if it is a matter for example of determining an increase in ohmic losses.

The invention will be described in detail in the following on the basis of exemplary embodiments with reference to the attached drawings. In the drawings:

DESCRIPTION OF THE INVENTION

Figure 1:
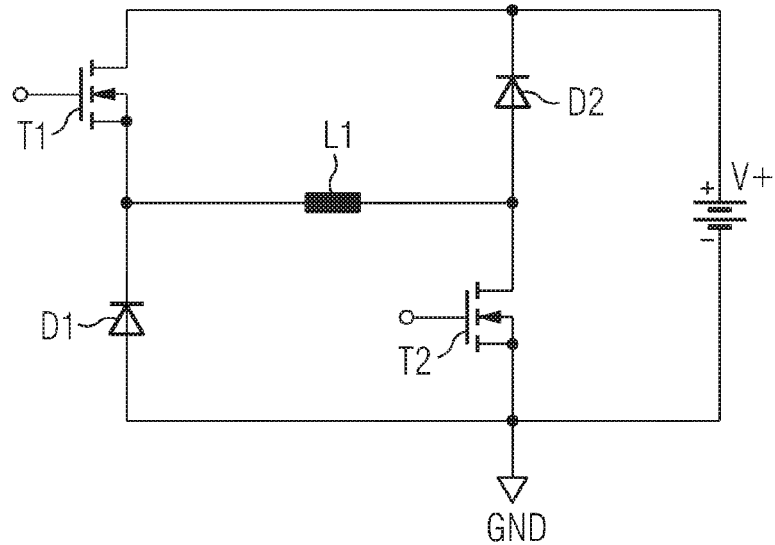
FIG. 1 shows a basic circuit arrangement (output stage) for PWM operation of an inductive load.
Figure 2:
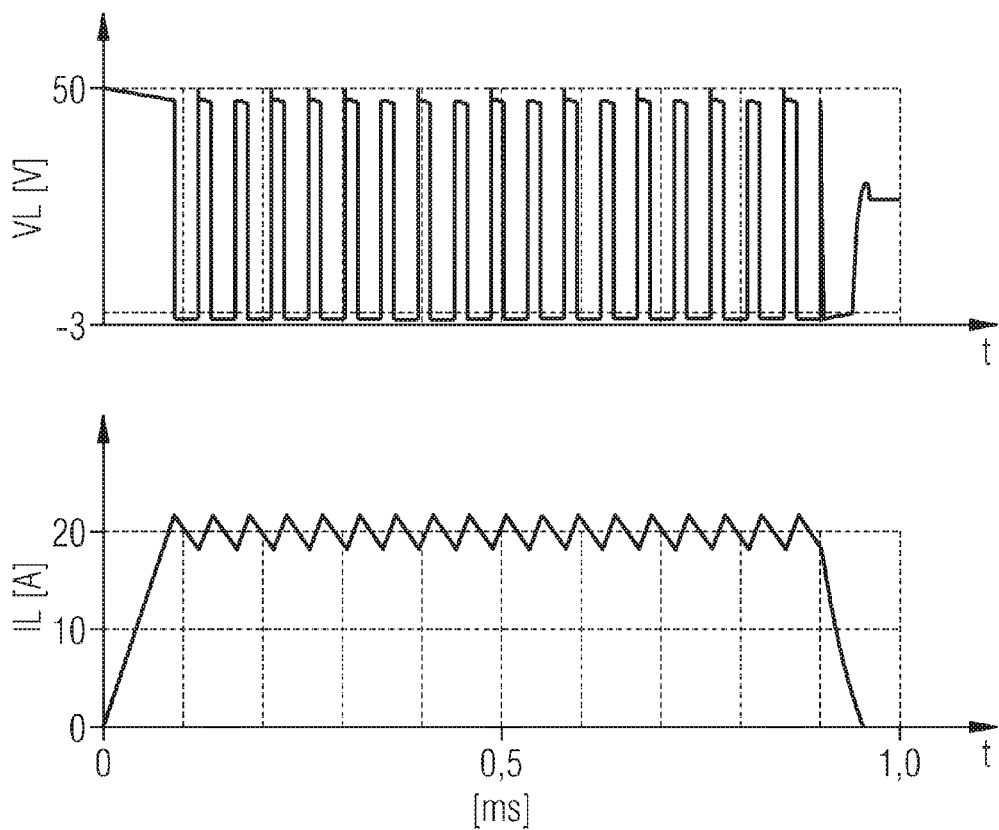
FIG. 2 shows voltage and current waveforms for PWM operation of the circuit arrangement shown in FIG. 1.

FIGS. 1 and 2 illustrate a basic circuit arrangement for the PWM operation of an inductive load L1 (FIG. 1) and also examples of waveforms of a load voltage VL and a load current IL as a function of the time t (FIG. 2).

The structure, mode of operation and disadvantages of the circuit arrangement (output stage) shown in FIG. 1 have already been described in the introduction.

A circuit arrangement according to the invention for operating an inductive load, wherein these disadvantages are largely eliminated and in particular a low-loss operation is enabled with simultaneous precise setting of the load current, will be described in the following with reference to the FIGS. 3 to 14.

Figure 3:
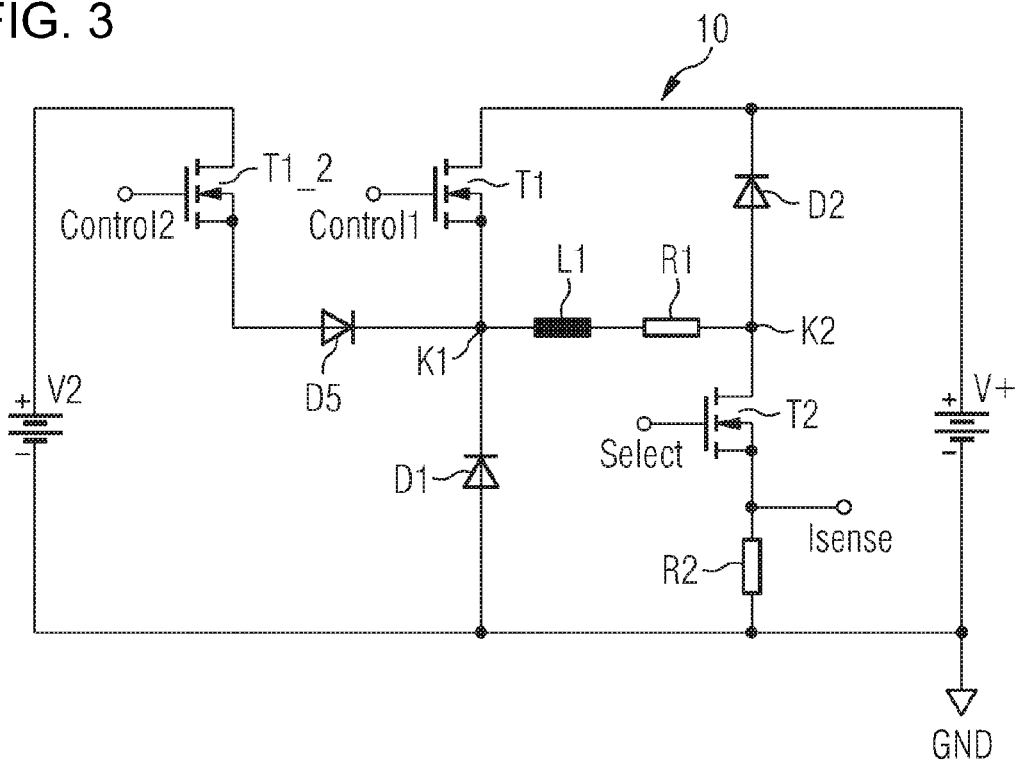
FIG. 3 shows a basic circuit arrangement (output stage) with a double voltage supply for operating an inductive load.
Figure 6:
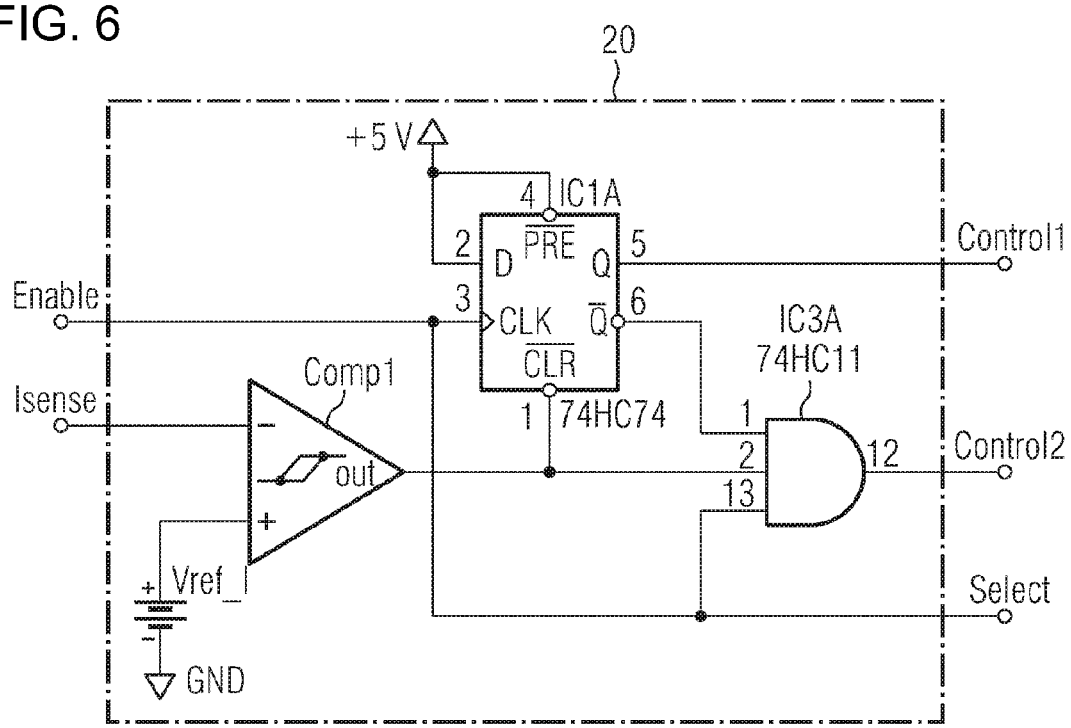
FIG. 6 shows a sequence control system for operation of the output stage according to FIG. 3.
Figure 7:
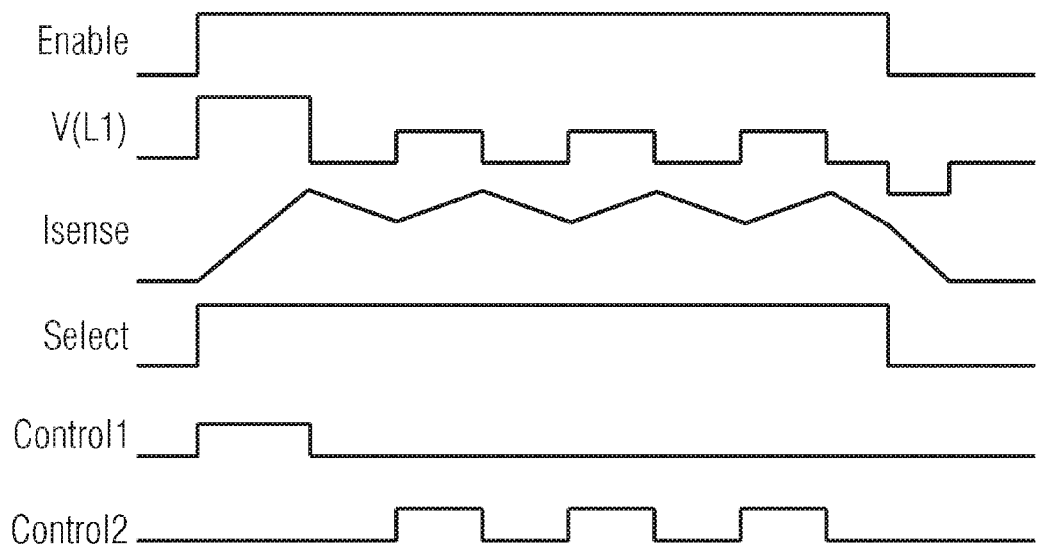
FIG. 7 shows signal waveforms in the sequence control system shown in FIG. 6.
Figure 8:
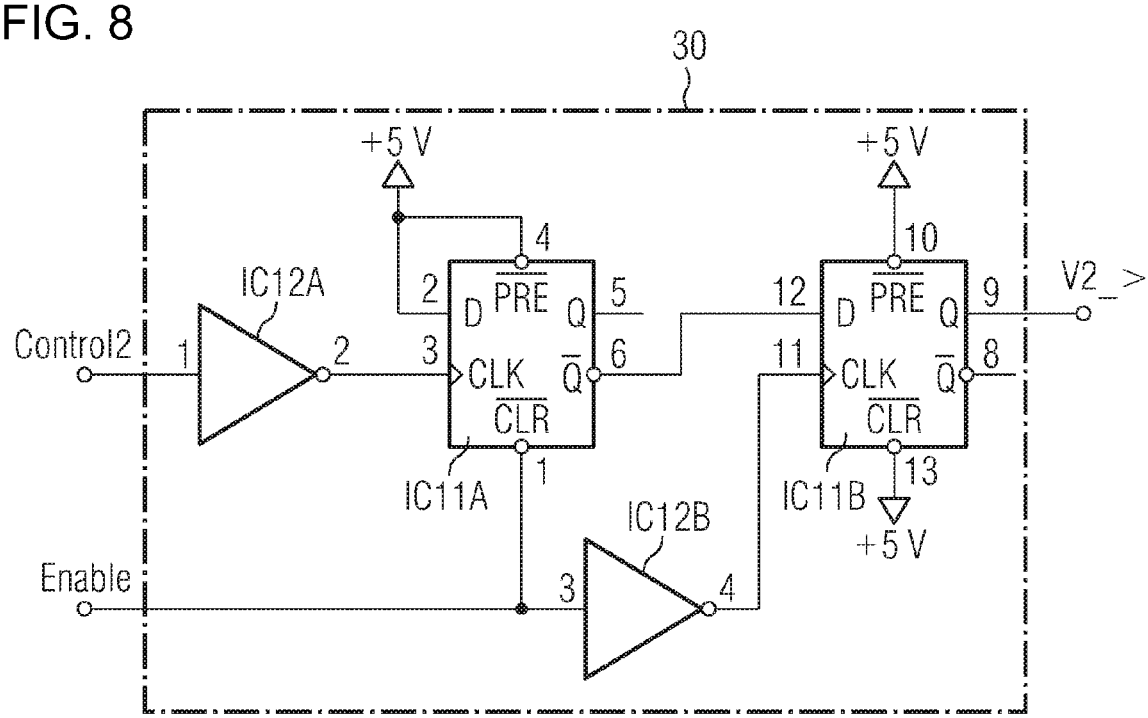
FIG. 8 shows an operating current evaluation circuit for the sequence control system shown in FIG. 6.
Figure 10:
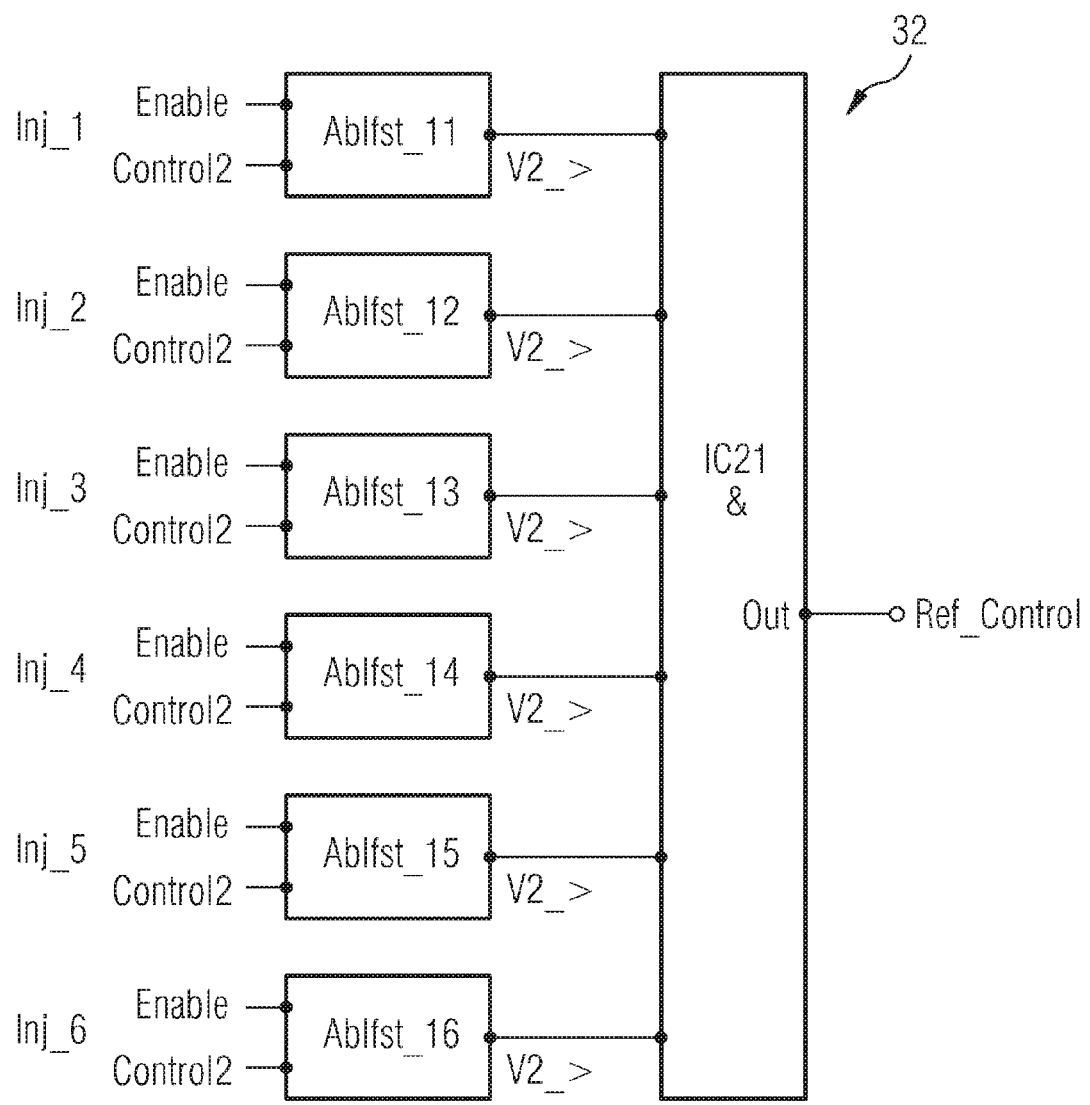
FIG. 10 shows a logic circuit for logically operating on a plurality of sequence control systems according to FIG. 6.
Figure 12:
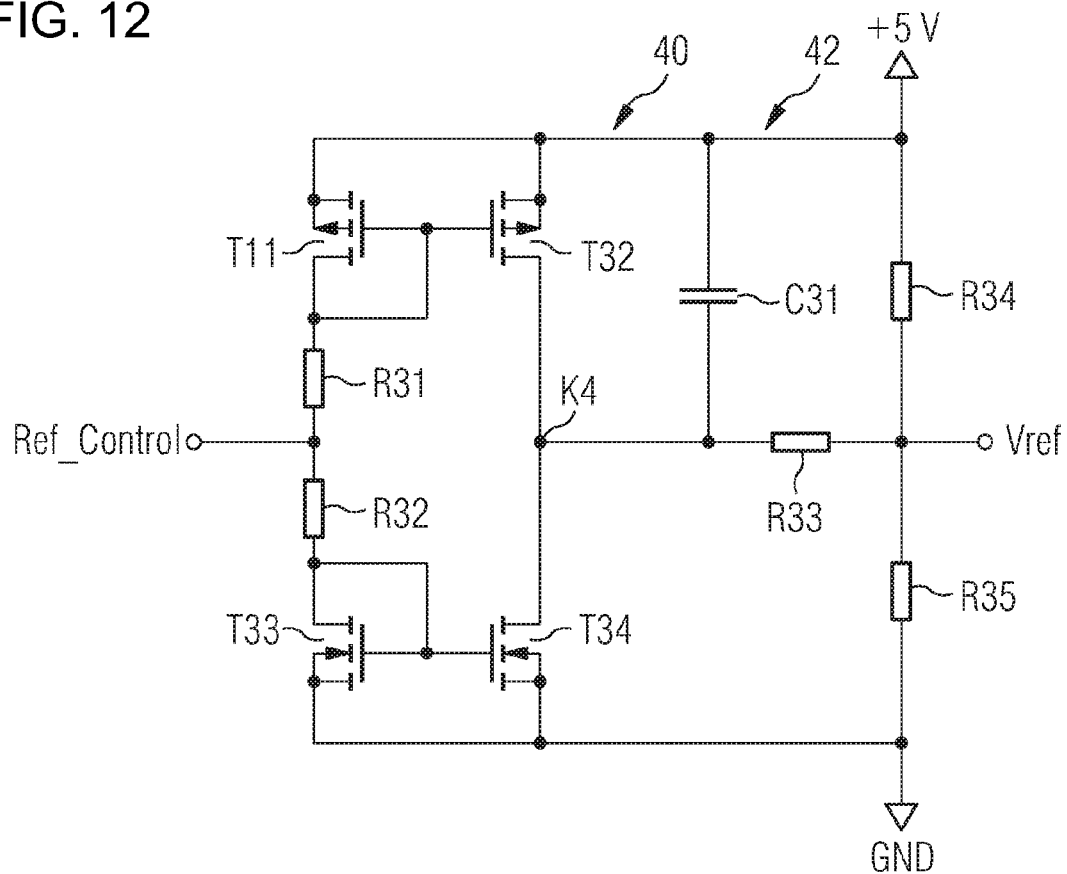
FIG. 12 shows a bipolar current source facility for controlling a reference voltage.
Figure 13:
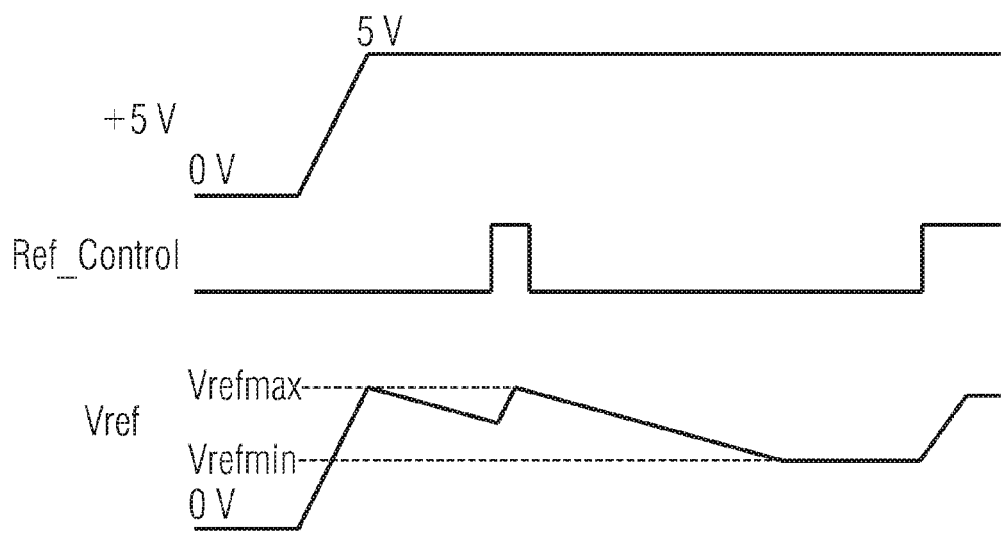
FIG. 13 shows signal waveforms in the facility shown in FIG. 12 to illustrate reference voltage control.
Figure 14:
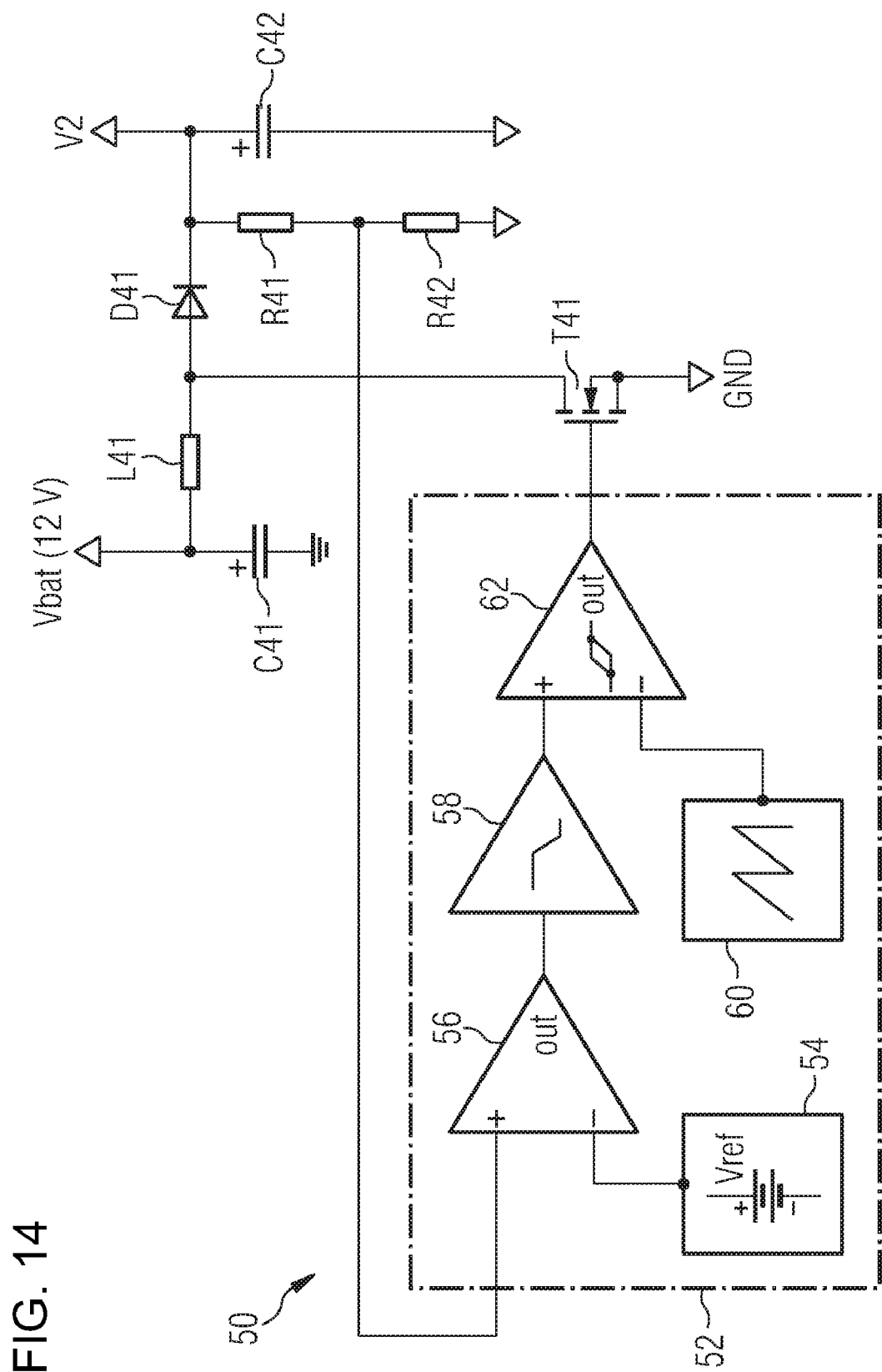
FIG. 14 shows a schematic diagram of a DC/DC converter for generating a supply voltage ("second operating voltage") for the output stage shown in FIG. 3.

The circuit arrangement according to the invention comprises an output stage according to FIG. 3, a sequence control system according to FIG. 6, an operating current evaluation circuit according to FIG. 8, optionally a logic circuit according to FIG. 10, a bipolar current source facility according to FIG. 12 and also a DC/DC converter according to FIG. 14. The structure of these circuit components will be described in the following and illustrated in respect of the mode of operation by means of respective examples of signal waveforms.

A special attribute of the output stage 10 represented in FIG. 3 in comparison with the output stage shown in FIG. 1 consists in the fact that this output stage is supplied from two voltage sources which deliver a first operating voltage V+ and also a second operating voltage V2 which is smaller (approximately by a factor of 2) than the first operating voltage V+.

Starting from a first (here positive) terminal on the first operating voltage source, one path runs by way of a transistor T1, the inductive load L1, a resistor R1, a transistor T2 and a resistor R2 to a second (here negative) terminal on the first operating voltage source. The resistor R1 symbolizes electrical resistances, unavoidable in practice, of line arrangements or transition contacts in the area of this current path or between the actual output stage and the inductive load L1. The resistor R2 is used by a control facility (not shown) as a current measuring facility for measuring the load current IL actually flowing through the load L1. A voltage drop at the "shunt resistor" R2 is fed as a sensor signal Isense to the control facility. During operation the control facility generates the control signals Control1, Select and Control2 shown in FIG. 3 for driving (switching on and off) the transistors T1, T2 and T1_2 shown. A switching node K1, which connects the transistor T1 to the load L1, is connected in the manner shown by way of a freewheeling diode D1 to the second terminal on the first operating voltage source. A switching node K2, which connects the resistor R1 to the transistor T2, is connected in the manner shown by way of a recuperation diode D2 to the first terminal on the first operating voltage source.

By using the hitherto described circuit components of the output stage 10, output stage operation which has already been described with reference to FIGS. 1 and 2 could take place. In order to functionally separate a rapid current buildup in a first operating phase and a current setting in a second operating phase, the additional second operating voltage source (voltage V2) is however provided for the output stage 10. A first terminal on the second operating voltage source (here positive terminal) corresponding in its polarity to the first terminal on the first operating voltage source is connected by way of the transistor T1_2 and a diode D5 poled in the flow direction to the switching node K1. The second (here negative) terminal on the second operating voltage source is connected to the second terminal on the first operating voltage source (and where applicable to an electrical ground).

The inventive operation of the output stage 10 will be described further below with reference to FIG. 5. For clarification of the functional separation of rapid current buildup and current setting as such, which is implemented with the output stage 10, a "pure double voltage operation" (without PWM current setting) likewise possible in principle will however first be explained with reference to FIG. 4. This simplified (not inventive) operation functions as follows:

T1 and T2 are switched on at the beginning of an energizing phase. The first operating voltage V+, also referred to in the following as "boost voltage", is then essentially present at the inductive load L1 and the load current IL through the load L1 rises rapidly. When the desired load current for the energizing phase has been attained, which can be easily sensed by evaluating the current measurement signal Isense, then T1 is switched off and T1_2 is switched on. From this point in time the load current IL is delivered by the second operating voltage source from the second operating voltage V2. It flows starting from the positive terminal on the second operating voltage source by way of the transistor T1_2, the diode D5, the load L1, the resistor R1, the transistor T2 and the current-sensing resistor R2 to the second terminal on the second operating voltage source.

In this second operating phase the load current IL depends on the second operating voltage V2, the forward voltage of the diode D5 and the sum of the resistances (here symbolized by R1 and R2) in the current path. In practice, such current path resistances are produced in particular as a result of a resistive component of the load impedance, line and contact transition resistances, switch-on resistances of the transistors T1_2, T2 etc.

Figure 4:
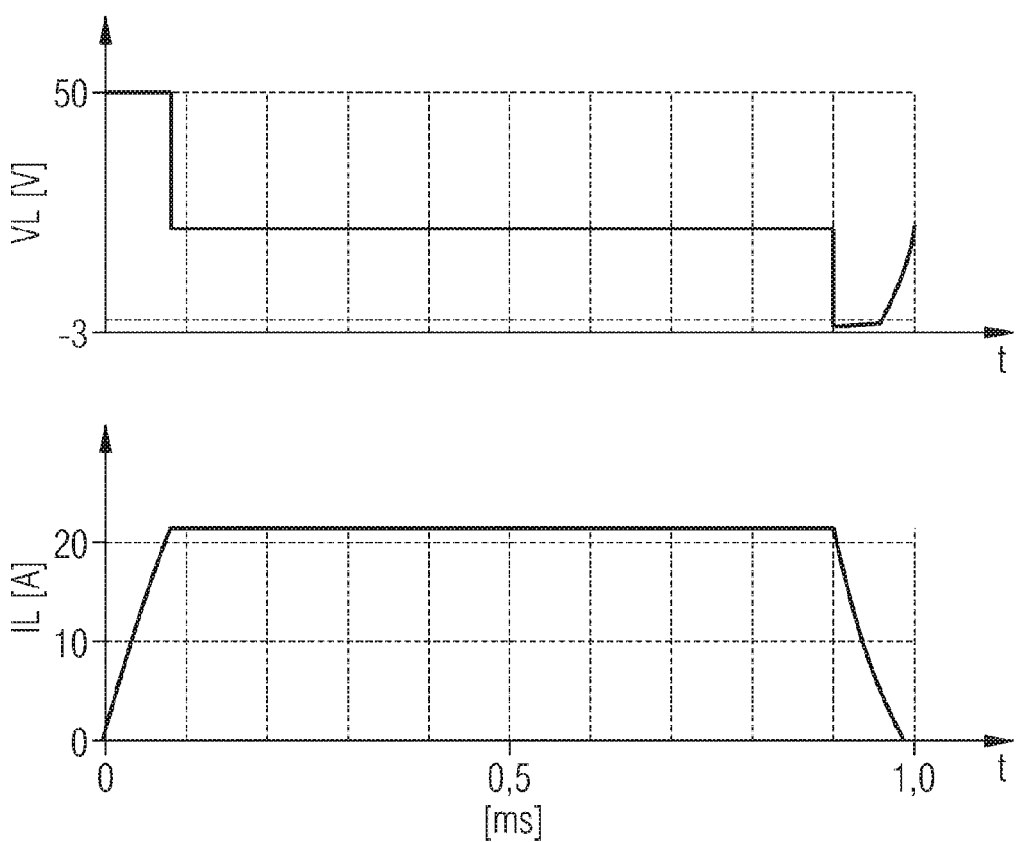
FIG. 4 shows voltage and current waveforms for a "simplified" operation of the circuit arrangement shown in FIG. 3.
Figure 5:
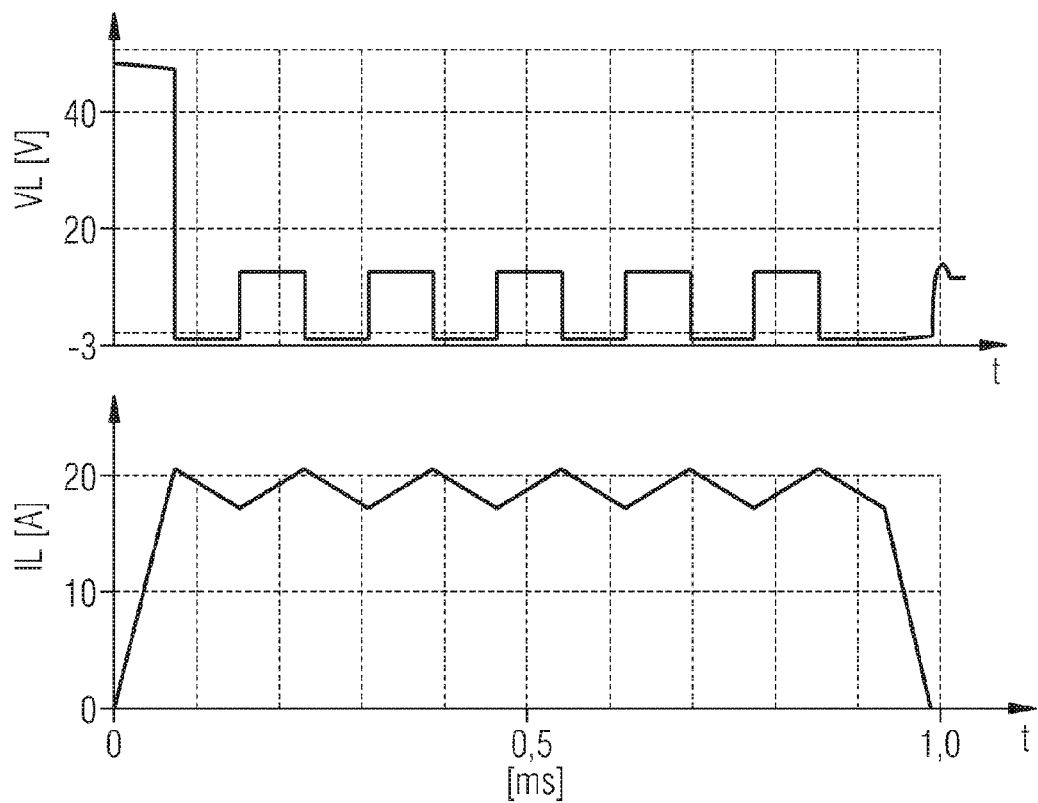
FIG. 5 shows voltage and current waveforms for operation of the circuit arrangement shown in FIG. 3 with double voltage supply and PWM operation.

The resulting waveforms of the load voltage VL and the load current IL are shown in FIG. 4 as a function of the time t.

Since in practice in particular the sum of the resistances in the current path is subject to variations, on account of this pure double voltage operation which is possible in principle a precise setting of the load current IL to a desired load current is made considerably more difficult.

According to the invention, in the second operating phase in which the load L1 is supplied from the second operating voltage source a setting of the desired load current IL is therefore provided by suitably switching on and switching off the second operating voltage V2.

This operation with double voltage supply and PWM setting illustrated by way of example by FIG. 5 functions as follows: In the second operating phase, T1_2 is not switched on statically but is switched on and off repeatedly, as a result of which an average value is yielded in the time average for the load current IL (PWM operation). By means of a suitable variation of the duty cycle, the desired current value can thus be more precisely set or regulated (for example as described above with reference to FIGS. 1 and 2).

This circuit and operating concept for operating the inductive load L1, for example for actuating a magnetic valve, has a number of advantages. A first advantage consists in the fact that a DC/DC converter, in particular a switching regulator, which produces the increased second operating voltage V+ from a base voltage (for example, vehicle electrical system voltage of 12 V in the case of a motor vehicle), is subject to a load only during the first operating phase (current buildup). The level of efficiency of such a DC/DC converter therefore plays a lesser role in respect of the overall level of efficiency of the system. As a result this converter can moreover be designed to be considerably smaller and thus cheaper. The high instantaneous power at the switching transistor T1 occurs only once at switch-off. A further advantage consists in the fact that T1_2 is fed from a lower voltage (second operating voltage V2), with the result that the switching losses occurring at T1_2 in the second operating phase are correspondingly smaller. The switching frequency is also less because the load current IL accordingly changes more slowly. This in turn also has the advantageous consequence that the times during which the switching transistor T1_2 is switched on or switched off increase substantially, which becomes noticeable in a positive sense with regard to the EMC radiation. Finally, it is often possible in practice to dispense with an additional costly screening of a line arrangement (wiring harness for example) to the load L1. The EMC limit values required in practice are considerably easier to adhere to.

It would in principle be conceivable to supply the output stage 10 with a constant second operating voltage V2 or for example with a battery voltage of a motor vehicle. This is not provided with regard to the inventive operation of the output stage 10 because a serious problem results in this case for many application situations. In order to better understand the design of the second operating voltage source provided according to the invention, this problem will first be explained in the following.

As already mentioned, in the case of the output stage 10 the maximum load current IL possible in the second operating phase (supply from the second operating voltage source) is essentially determined by the value of the second operating voltage V2 and the sum of the resistances in the current path (R1 and R2 in FIG. 3). In order to be able to even attain a desired load current IL in the second operating phase, V2 must at least have a minimum value which is all the greater the greater are these resistances (and for example the forward voltage of the diode D5). In practice, in particular with regard to use in the automobile electronics sector, temperature and aging-related changes for example result in the resistances (load resistance, line and contact transition resistances, switch-on resistances of the transistors etc.). As a precaution, V2 must therefore be chosen to be greater than would be required in the normal case (ideal case). The temperature-related increase in resistance alone for a range—typical in the automobile sector when mounted close to the engine—from −30° C. to +150° C. is over 75%!

In the case of a system having a plurality of inductive loads such as the presented load L1 (for example regarding an injection system for a 6-cylinder engine having 6 injection valves), the load with the highest total resistance in the load current path must furthermore always be taken into consideration when setting the value for V2. Since a battery voltage or supply voltage cannot be set precisely at will in a high-volume production run in the automobile sector, further additions for component and manufacturing tolerances are then unavoidable. A typical value for this purpose is +/−10% for example.

For the case of provision of the second operating voltage V2 directly as a battery voltage of a motor vehicle (with a nominal value of 12 V for example) it would therefore be necessary to provide a DC/DC converter which produces a second supply voltage V2 increased by about 85% (22 V for example) from the battery voltage. This in turn has a number of serious disadvantages. The voltage of the 12 V supply available in the motor vehicle is no longer adequate. The voltage V2 must be generated by means of a further DC/DC converter for example from the 12 V vehicle electrical system voltage (costs, installation space). This second converter generates losses, which likewise grow with rising output voltage. Additional EMC filtering measures are required on account of the input current ripple of the converter. The increased voltage V2 (22 V for example) compared with the vehicle electrical system voltage results in a disproportional increase in switching losses in the transistor T2 because a higher switching voltage is present at this transistor. In addition, more switching processes result or an increased switching frequency results because the load current IL changes rapidly in intermittent operation. This in turn moreover gives rise to increased EMC radiation on account of the greater switching amplitude and frequency.

It would in principle be conceivable to reduce this problem by means of the following measures: minimizing the values and tolerances of the resistors in the current path, which would entail increased costs; minimizing the tolerances for setting and regulating V2, which would entail costlier components and problems regarding long-term stability; additional expenditure with regard to heat dissipation for the output stage, which would entail a costly mechanical solution; extensive analyses and measurements in order to find the minimum required value for V2 in the given application situation.

With regard to the inventive operation of the output stage 10, a quite different approach is however taken wherein the attainment of the desired load current during the second operating phase is monitored by monitoring means and on the basis of the result of this monitoring an adjustment of the second operating voltage V2 is carried out. With regard to the circuit components described in the following for implementing this adjustment, V2 is regulated dynamically in such a manner that the desired load current IL is always just, but reliably, attained regardless of the influencing variables described above. An example of the manner in which the adjustment is implemented will be described in the following with reference to FIGS. 6 to 14.

FIG. 6 shows the circuit diagram of a sequence control system 20 for operating the output stage according to FIG. 3. The sequence control system 20 comprises, as shown, a voltage comparator Comp1 subject to hysteresis, a D flip-flop IC1A and a triple AND gate IC3A.

The sequence control system 20 switches the transistors T1, T1_2 and T2 (control signals Control1, Control2 and Select) depending on the levels of the control signals Enable and Isense:

The transistors T1 and T2 are first switched on (start of the energizing phase; Enable jumps from "low" to "high" level). The current through T1, L1, T2, R2 rises until Isense has attained a predetermined upper value.

T1 is switched off as soon as the measurement signal Isense at resistor R1 has attained the upper value. The current through T1, L1, T2, R2 will consequently slowly fall until Isense has attained a lower value.

T1_2 is switched on as soon as Isense has attained the lower value. The current through T1, L1, T2, R2 consequently rises again until Isense has again attained the upper value.

T1_2 is switched off again as soon as Isense has attained the upper value etc.

T1_2 and T2 are both switched off (end of the energizing phase; Enable jumps from "high" to "low" level).

This function of the sequence control system 20 shown in FIG. 6 (cf. also the signal waveforms shown in FIG. 7) will be described again in detail in the following.

Start Condition—the Output Stage 10 is not Activated:

The flip-flop IC1A is reset, such that its non-inverting output Q has "low" level and its inverting output Q-Not has "high" level. The output signal Control1 therefore has "low" level.

Let the control input Enable have "low" level. The output signal Select therefore has "low" level. Let the voltage at the input Isense be zero. Vref_I designates a predefined load current reference, with which Isense is compared. As a result, the output from Comp1 assumes "high" level, such that the "low" active input CLR-Not of the flip-flop IC1A is not set.

The inputs of the AND gate IC3A are now connected to: Q-Not of the flip-flop ("high" level), output of the voltage comparator ("high" level), and control signal Enable ("low" level). Accordingly, the output signal Control2 has "low" level. T1_2 is switched off.

Activation of the Output Stage:

The input signal Enable jumps to "high" level. Accordingly, the signal Select jumps to "high" level and switches on the transistor T2 (FIG. 3).

With the jump of the Enable signal the flip-flop IC1A is also triggered, such that its non-inverting output Q jumps to "high" level. The output signal Control1 jumps to "high" level and switches on the transistor T1 (FIG. 3).

The inverting output Q-Not jumps to "low" level. The input signals of the AND gate IC3A are now connected to Q-Not of the flip-flop ("low" level), output of the voltage comparator ("high" level) and control signal Enable ("high" level). Accordingly, the output signal Control2 has "low" level. T1_2 remains switched off.

T1 and T2 are now switched on and the load current IL begins to flow from V+ through T1, L1, R1, T2, R2 to ground GND (cf. FIG. 3). The voltage Isense correspondingly rises at the resistor R2. If the value of Isense exceeds the value of Vref_I plus the hysteresis of the voltage comparator Comp1, then the output of the voltage comparator jumps to "low" level.

Switchover of the Output Stage Supply from V+ to V2:

Since the output of the voltage comparator Comp1 is at "low" level, the flip-flop IC1A is reset by way of its CLR-Not input connected to that output. As a result, the signal from the non-inverting output Q jumps to "low" level and the control output Control1 assumes "low" level. This switches off the transistor T1, such that L1 (FIG. 3) is no longer connected to the boost voltage V+.

The current flow through L1 now slowly reduces, wherein the voltage at the node "cathodes of D1, D5, source of T1, L1"—driven by the electromotive force (EMF) of the inductive load L1—reverses and the current now flows through D1 to ground. As a result, the value of Isense also slowly reduces.

If the value of Isense falls below the value of Vref_I less the hysteresis of the voltage comparator Comp1, then the output of the voltage comparator jumps to "high" level. This has no effect on the flip-flop IC1A or the control output Control1 ("low"). The input signals of the AND gate IC3A are now however connected to: Q-Not of the flip-flop ("high" level), output of the voltage comparator ("high" level), and control signal Enable ("high" level). Accordingly, the output signal Control2 has "high" level. T1_2 will now be switched.

L1 is thus connected to V2 and the current begins to rise again. Correspondingly, the voltage Isense also rises in turn until its value exceeds the value of Vref_I plus the hysteresis of the voltage comparator Comp1, whereupon the output of the voltage comparator again jumps to "low" level. By this means the signal Control2 is set to "low" level and T1_2 is switched off. A renewed freewheeling phase begins with falling current flow through D1 until the value of Isense once again lies below the value of Vref_I plus the hysteresis of the voltage comparator Comp1 and T1_2 is once again switched on.

T1_2 is therefore switched on and off repeatedly and the load current through L1 oscillates around an average value.
Switch-Off of the Output Stage:

At the end of the activation phase of the output stage 10 the control signal Enable switches to "low" level. As a result, the output signal Select jumps to "low" level and T2 switches off. The output of the AND gate—and thus the output signal Control2—likewise jumps to "low" level and switches T1_2 off.

L1 is thus disconnected on both sides. Driven by its EMF, the voltage at L1 reverses and the current flows now through D1 and D2, such that L1 discharges quickly into the supply V+. The original state is now restored.

To summarize thus far, the output stage 10 (FIG. 3) constitutes energizing means for energizing the inductive load L1, which are designed so as to apply a first operating voltage V+ at the load during a first operating phase and to apply a second operating voltage V2, which is smaller than the first operating voltage V+, in intermittent fashion at the load during a subsequent second operating phase. The sequence control system 20 (FIG. 6) constitutes setting means for controlling the intermittent operation of the output stage 10 during the second operating phase in order to set a desired load current by suitably switching on and switching off the second operating voltage V2 at the load L1, R1.

At this point it should be noted that in the case of a system having a plurality of inductive loads (for example a plurality of injection valves of an internal combustion engine) a corresponding plurality of sequence control systems of the type shown in FIG. 6 is provided and a plurality of input-side control signals (Enable1, Enable2, . . . ) is used. As will be described further below, in this case the load with the highest total resistance in the current path is taken into consideration for the adjustment of the second operating voltage V2. In practice, it is namely often difficult to predict which of a plurality of loads has the highest resistance value at a given point in time.

FIG. 8 shows the circuit diagram of an operating current evaluation circuit 30 for monitoring the attainment of the desired load current IL during the second operating phase.

As shown, the operating current evaluation circuit 30 comprises two inverters IC12A, IC12B and two D flip-flops IC11A, IC11B.

On the input side, the signals Enable and Control2 are input to the operating current evaluation circuit 30, from which signals is formed a signal V2_> on the output side. The operating current evaluation circuit 30, or the signal V2_> formed from it, serves to determine the attainment of the upper current limit (switchover of the comparator Comp1 which can be seen in the sequence control system shown in FIG. 6) during the second operating phase. This can be recognized from an actuation of the transistor T1_2 for the duration of the signal Enable, the signal Control2 must therefore assume the "high" level at least once.

Figure 9:
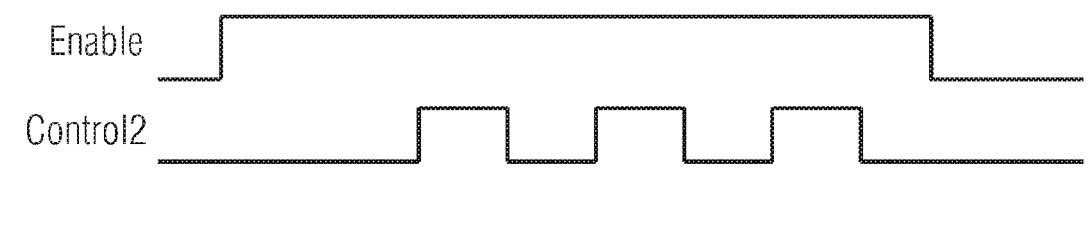
FIG. 9 shows signal waveforms in the operating current evaluation circuit shown in FIG. 8.
Figure 9:
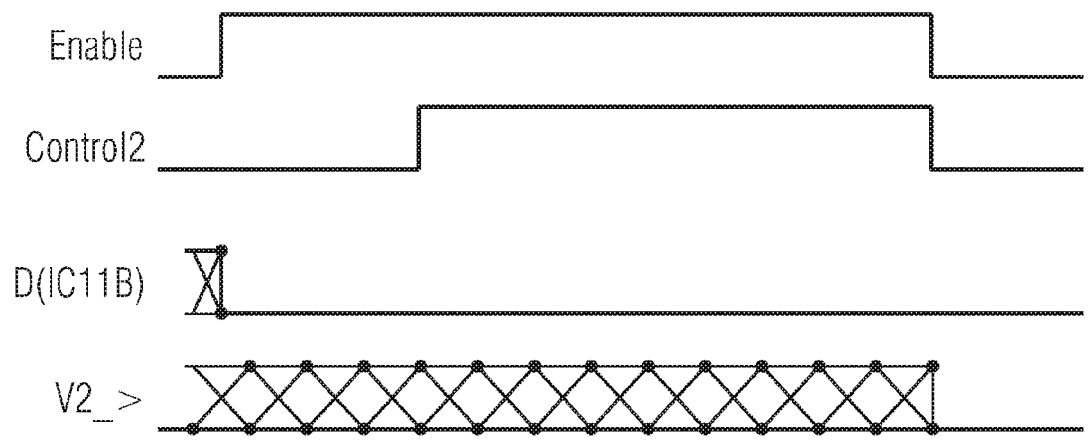

FIG. 9 shows timing waveforms of signals occurring for two possible operating cases. The signal waveforms represented in the upper part of FIG. 9 are produced for one operating case in which the upper current limit (and thus naturally also the desired load current) is attained during the second operating phase (referred to below as "Case 1"). In the period of time represented the upper current limit is actually attained three times, which can be recognized from the three variations of the signal Control2.

The signal waveforms represented in the lower part of FIG. 9 illustrate an operating case in which the upper current limit is not attained (referred to below as "Case 2").

This monitoring functionality of the operating current evaluation circuit 30 shown in FIG. 8 (cf. also the signal waveforms shown in FIG. 9) will be explained again in detail in the following.
Start Condition:

The flip-flops IC11A, IC11B have been reset, such that their non-inverting outputs Q have "low" level in each case and their inverting outputs Q-Not have "high" level in each case. The input signals Enable and Control2 have "low" level. The output signal V2_> has "low" level.
Start of the Sequence Control System 20 (FIG. 6):

At the beginning of the activation of the output stage 10 (FIG. 3) the input signal Enable jumps to "high" level. As a result, the flip-flop IC11A reset until then by way of its input CLR-Not is released. Its non-inverting output Q has "low" level.

The signal Control2 actuates—as described above—the transistor T1_2, which process in turn is controlled by the value of the current measurement signal Isense.

For the operating current evaluation circuit 30, the at least one-time attainment of the upper current value of Isense is now relevant in the phase as long as the current is delivered from the supply V2 (second supply voltage). This attainment is recognized from the fact that T1_2 is switched on and off at least once, or the signal Control2 jumps at least once from "low" level to "high" level and back.
Case 1—the Load Current Through L1 is Attained During Supply from V2:

In order to actuate T1_2, the sequence control system 30 switches the signal Control2 to "high" level, whereupon the signal inverted by the inverter IC12A at the trigger input CLK of IC11A jumps from "high" to "low" level.

The current through L1 now rises until—communicated by way of the value of Isense—the upper switch-off point is attained and the signal Control2 jumps to "low" level.

The inverter IC12A converts this into a jump to "high" level, which triggers the flip-flop IC11A, such that its output Q takes over the "high" level of the data input D. This state is retained for the remainder of the activation phase of the output stage.

At the end of the output stage activation phase the signal Enable jumps to "low" level. The inverter IC12B inverts this signal such that the flip-flop IC11B is triggered by way of its trigger input CLK. As a result, the output Q of IC11B takes over the level of IC11A, output Q and the signal V2_> assumes "high" level.

Note: Because the signal Enable assumes "low" level at the end of the activation phase, the flip-flop IC11A is reset, such that its non-inverting output Q assumes "low" level. Should this now happen before the flip-flop IC11B has taken over the previously present (valid) "high" level, then this can be corrected with a delay element between IC11A, output Q and IC11B, input D. The required delay time (for example typically <100 ns) depends on the circuit components specifically used. A delay element can be constructed for example with a low-pass filter consisting of a series resistor and a parallel capacitor.
Case 2—the Load Current Through L1 is not Attained During Supply from V2:

Here too T1_2 is switched on by the signal Control2 assuming "high" level. The inverter IC12A switches the trigger input of IC11A correspondingly to "low" level, however this remains the case for the entire activation phase. IC11A is therefore not triggered and its output Q remains at "low" level.

At the end of the activation phase IC11B is triggered by way of the inverted Enable signal and now takes over the "low" level of IC11A at its non-inverting output Q. The signal V2_> thus jumps to "low" level and remains there until such time as Case 1 has been successfully carried out.

This serves to ensure that in the event of the upper switch-off point of the current measurement not being attained V2_> permanently assumes "low" level and in consequence thereof V2 is increased (to be described further below) until such time as this state is corrected.

As has already been mentioned above, in the case of a system having a plurality of inductive loads a plurality of sequence control systems such as for example the sequence control system 30 represented is required. Since this special case is relevant in particular to an application of the invention in respect of an injection system of a motor vehicle, the corresponding extension in terms of circuitry will be explained initially in the following by way of example of a system having 6 injection valves and 6 sequence control systems (together with respective operating current evaluation circuit) with reference to FIGS. 10 and 11.

Figure 11:
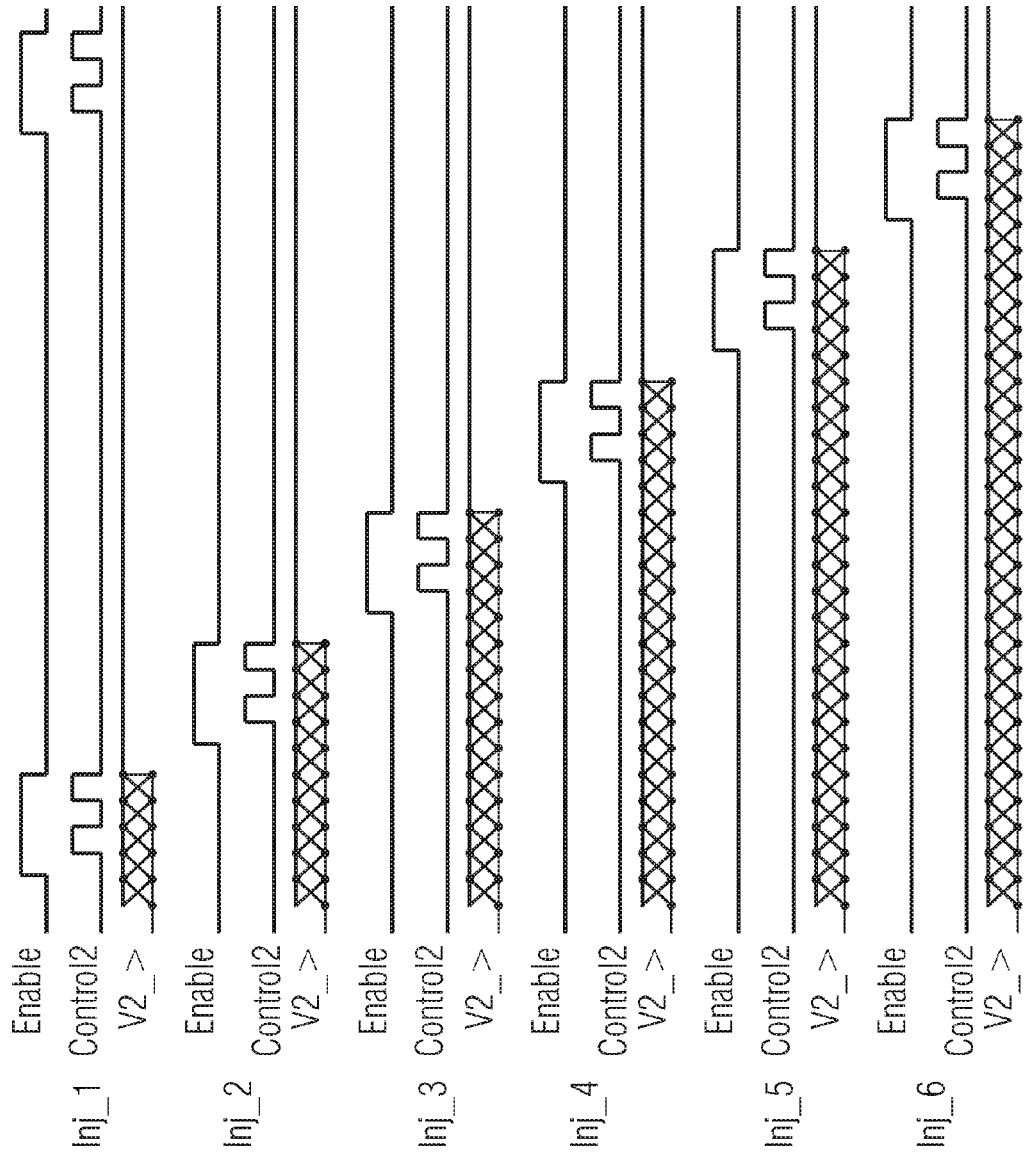
FIG. 11 shows signal waveforms in the logic circuit shown in FIG. 10.

In a common timing waveform diagram FIG. 11 shows the signals Enable and Control2 for 6 sequence control systems of the type shown in FIG. 6 and the signal V2_> for 6 respectively associated operating current evaluation circuits of the type shown in FIG. 8; for 6 different fuel injectors (symbolized by the designations Inj_1, Inj_2, .... Inj_6) which are to be actuated in time-staggered fashion for respective fuel injections corresponding to an injection sequence of the internal combustion engine in question. Accordingly, the signal waveforms shown in FIG. 11 are staggered in time with respect to one another.

In FIG. 10, the six sequence control systems are designated by Ablfst 11, Ablfst 12, .... Ablfst 16. As shown in FIG. 10, the respective output signals V2_> of these sequence control systems are combined in an AND gate IC21 as one signal Ref_Control. This signal Ref_Control has "high" level as long as the corresponding inductive loads (magnetic valves of the injectors) attain the upper current limit in the intermittent operation of the second operating phase. If however at least one load does not attain the upper current limit, or the desired load current, then the signal Ref_Control jumps to the "low" level. The "low" level is maintained until such time as all loads have again correctly attained the upper current limit.

The logic circuit 32 shown in FIG. 10 is optional. It is only required for the case of actuating a plurality of loads. The indicator signal Ref_Control output by the logic circuit 32 is to a certain extent analogous to the indicator signal V2_> of the operating current evaluation circuit for a single load.

The operating current evaluation circuit 30 (FIG. 8), where applicable a plurality of such circuit components together with a logic circuit such as that shown in FIG. 10, forms monitoring means for monitoring the attainment of the desired load current during the second operating phase. The result of this monitoring is given by the signal V2_> of a single operating current evaluation circuit 30 or the operation signal Ref_Control of the logic circuit.

On the basis of this monitoring result, finally, according to the invention an adjustment of the second operating voltage V2, described in the following, is carried out. The following description relates in this situation, merely by way of example, to the case of operation of a plurality of inductive loads and accordingly the case of using the signal Ref_Control for the need-based setting of V2.

In the exemplary embodiment described, the signal Ref_Control is used to control a bipolar current source 40 which can be seen in FIG. 12, or more precisely to switch over between two modes of operation. In a first operating mode, the current source 40 delivers a positive current to a switching node K4, whereas in its second operating mode the current source 40 delivers a negative current to the switching node K4. The level of the input signal Ref_Control determines the operating mode in this situation. The structure of the current source 40 which can be seen from FIG. 12 is of an already known type and does not therefore require any further explanation. It is worth mentioning that the positive current delivered by the current source 40 in the first operating mode in the illustrated example is considerably greater than the negative current delivered in the case of the second operating mode. This is achieved in the case of the circuit shown by means of correspondingly different values of the resistors R31 and R32.

The output of the current source 40 (switching node K4) is connected to an integration stage 42 comprising a capacitor C31 which integrates the average current of the connected current source 40. The capacitor C31 is connected to a supply potential (+5 V), such that one output of the current source facility 40, 42 delivers one output signal Vref with the value of this supply potential (here: +5V) at the start. The switching node K4 of the current source facility is connected by way of a resistor R33 to a center tap of a voltage divider R34, R35, which during operation of the arrangement generates a reference voltage Vref derived from the 5 V supply. The resistor R33 limits the adjusting range for the reference voltage Vref through the current source 40.

If Ref_Control has "low" level, then the current source 40 switches to positive current (coming from the 5 V supply) and Vref rises. However, if Ref_Control has "high" level, then the current source 40 switches to negative current (to ground) and Vref falls.

The reference voltage Vref generated by the bipolar current source facility 40, 42 now serves to regulate the second operating voltage V2 used by the output stage 10 (FIG. 3). If Vref rises, then the value of V2 also rises. If Vref falls, then V2 will also fall. This regulation capability provided in accordance with the exemplary embodiment is shown by way of example in FIG. 13 with reference to corresponding signal waveforms. In this figure, the upper and lower limits for the adjusting range of the reference voltage Vref are also drawn in and designated by Vrefmax and Vrefmin.

FIG. 14 is a schematic diagram of a DC/DC converter 50 for generating the second operating voltage V2 from a base voltage (vehicle electrical system voltage Vbat (here for example 12 V battery voltage)). The converter 50 is built in the manner shown as a switching regulator. The principal item of the switching regulator is a control module, wherein in the exemplary embodiment illustrated this is a module from the company Texas Instruments, commercially obtainable under the model designation "SG 2524". This module contains a connection 54 for the entry of a voltage reference Vref (which is delivered by the bipolar current source facility from FIG. 12), an error amplifier 56, a regulator 58, a sawtooth generator 60, a comparator 62, and also further function groups, not included in the drawing for the sake of simplicity.

The error amplifier 56 detects the difference between Vref and a voltage at the center tap of a voltage divider R41, R42. The latter tap voltage is representative of the value of the output voltage V2. From this the regulating amplifier 58 connected downstream generates a DC voltage which is compared in the comparator 62 with the sawtooth voltage of the sawtooth generator 60. A signal of constant frequency with variable duty cycle, which controls a switching regulator transistor T41, is thus produced at the output of the comparator 62. If T41 is switched on, then a coil L41 is energized from the battery voltage Vbat. If T41 is switched off, then the coil current flows from L41 by way of a diode D41 into a capacitor C42 and thus delivers the energy for the provision of the second supply voltage V2. As a result, the energy removed by the consumer is delivered subsequently at the output terminal of the converter 50 (voltage V2). A capacitor C41 buffers the supply voltage Vbat. The purpose of regulation is that the tap voltage at the voltage divider R41, R42 has the same value as the entered reference voltage Vref, by which means V2 is also stabilized to a value depending on Vref (V2 is proportional to Vref). The structure of the switching regulator 50 illustrated is naturally only to be understood as an example and could also be modified accordingly in practice.

With regard to the exemplary embodiment described, the circuit arrangement according to the invention for operating a plurality of injection valves thus comprises:
the output stage 10 (FIG. 3), wherein a multiple parallel arrangement of transistors T2 known per se is provided for each injection valve (inductive load L1) (T1 is used for all injection valves),
a plurality of sequence control systems 20 (FIG. 6),
a plurality of operating current evaluation circuits 30 (FIG. 8),
the logic circuit 32 (FIG. 10),
the bipolar current source facility 40, 42 (FIG. 12), and
the controlled DC/DC converter 50 (FIG. 14).

The adjustment behavior of the circuit arrangement according to the invention can be described as follows: Initiated by the operating current evaluation circuit 30 (FIG. 8), and linked by means of the logic circuit 32 (FIG. 10), Vref is controlled by the current source facility 40, 42 (FIG. 12) in such a manner that the second operating voltage V2 assumes a value which is only just what is required in order to attain the upper operating current limit (and thus the desired load current) for all inductive loads L1 (injection valves).

In this situation, the regulation facility executes a dead-time oscillation. Starting from a higher (more reliable) second operating voltage V2, this voltage V2 drops slows until one of the inductive loads L1 no longer attains the upper operating current limit. Due to the different current values of the bipolar current source 40 for the latter's positive and negative currents, in this case the second operating voltage V2 rises relatively quickly until all the inductive loads again attain the upper operating current limit in further operation. Subsequently, V2 drops slowly once more and the adjustment cycle begins again.

The maximum possible voltage of V2 (defined by the upper limit Vrefmax of the reference voltage control) can, without any disadvantage on account of the dynamic regulation, be chosen higher than would be necessary for reliable operation of the loads in the normal case (in normal operation V2 always has the minimum possible voltage). Even in the case of a load with a marginally high, or slightly too high, resistance such an increase in the maximum value of V2 means that the desired operating current is maintained. This also extends the field of use of the load in question.

With regard to the circuit arrangement according to the invention, it is moreover possible without any problems to detect an unacceptable rise in resistance in the current path of the load as a result of the fact that the adjusted second operating voltage V2 is monitored, in particular for example measured and compared with a nominal range (upper and/or lower limit value) provided for this purpose. A response by such a limit value detection facility can be used for example to provide early warning of an imminent failure of a fuel injector if the upper limit value lies somewhat below the maximum possible voltage of V2.

Alternatively, or in addition, it is possible to determine the actual value of V2 and compare it with a predefined setpoint value. When the invention is used in the case of an injection system this setpoint value can be formed for example initially from a start value (for example, desired setpoint operating current multiplied by a nominal resistance value in the load path). In this connection, further influencing variables can also be taken into consideration, such as for example at least one temperature (injector temperature, for example, derived from the oil temperature of the engine), derivative-action values for injector and lead resistances etc.

A significant deviation of the actual value of V2 from the predefined, in particular for example calculated, setpoint value can then be used for detecting an excessive or unacceptable rise in resistance in the load current path. This permits a refined, dynamic monitoring of the load resistance.

To summarize, the reliable attainment of the operating current in all injectors is ensured by the inventive adjustment of the second operating voltage V2. The following advantages can result in particular:
The second operating voltage V2 is regulated to a comparatively small value which is required in order to attain the desired load current in all injectors.
Possible additions for changes in resistance, manufacturing tolerances etc. can be reduced as far as possible.
As a result of the lower voltage value of V2 in the nominal case, the level of efficiency of that DC/DC converter which generates this operating voltage is improved.
The input current ripple also drops, such that possible EMC filtering measures can be implemented entailing less effort.
The power loss of the switching transistors in the output stage is significantly reduced.
As a result of the reduced power loss, the heat dissipation concept of the facility in question (engine control unit in a motor vehicle, for example) can in turn be simplified.
The EMC radiation is reduced as a result of the lower PWM voltage and frequency.
The overall system can be made more error-tolerant. If an increased maximum value is permitted for the regulation of V2, then even in the case of unacceptably increased total resistance in the current path of the load the desired operating current can still be attained.
If moreover an overvoltage recognition facility for V2 is also added, then in the case of a creeping increase in resistance (contact corrosion, for example) an imminent failure can be recognized in good time and eliminated. In the automobile sector, this avoids a breakdown of the vehicle on account of a malfunction of the fuel injection.

With regard to the described circuit arrangement or the operating method implemented therewith, the following special features can be provided, as already mentioned:
Detecting an upper switch-off point of the load current during PWM operation (second operating phase) of the load/loads.
Storage of the result at which the respective load current has attained the upper switch-off point.
Logical linking of the storage results for all of a plurality of operated loads.
Use of a logical linkage signal (for a plurality of loads) for controlling a reference voltage of a DC/DC converter for generating the second operating voltage.
Limiting the control range for the reference voltage.

Comparatively rapid rise in the reference voltage (and thus of V2) if one or more loads do not attain the upper switch-off point for the load current; comparatively slow drop in the reference voltage (and thus of V2) as long as the load or all loads attain the upper switch-off point for the load current.

Measurement or storage of the value of V2 depending on external influencing variables (oil temperature of an engine, for example).

Determination of a relevant deviation of V2 relative to the stored values.

Recognition of an imminent failure, caused by an unacceptably high total resistance in the current path of the load/loads.

The invention claimed is:

1. A circuit arrangement for operating an inductive load, comprising:
   an energizing device for energizing the load, said energizing device applying a first operating voltage at the load during a first operating phase and intermittently applying a second operating voltage, which is smaller than the first operating voltage, at the load during a subsequent second operating phase;
   a setting device for controlling the intermittent operation of the energizing device during the second operating phase for setting a desired load current by suitably switching on and switching off the second operating voltage at the load;
   a monitoring device for monitoring an attainment of a desired load current during the second operating phase;
   and an adjustment device connected to said monitoring device for adjusting the second operating voltage based on a result obtained by said monitoring device.

2. The circuit arrangement according to claim 1, wherein the inductive load is a magnetic valve of a fuel injection system of an internal combustion engine.

3. The circuit arrangement according to claim 1, wherein said energizing device comprises a switching transistor arrangement for switching on and switching off the second operating voltage at the load.

4. The circuit arrangement according to claim 1, wherein the energizing device is driven in pulse-width-modulation during the second operating phase and said setting device is configured to vary a PWM duty cycle in order to set the desired load current.

5. The circuit arrangement according to claim 1, wherein said setting device is configured to provide on-off control such that the second operating voltage is switched off as soon as the load current attains an upper current limit and the second operating voltage is switched on as soon as the load current attains a lower current limit.

6. The circuit arrangement according to claim 1, wherein said monitoring device is configured to determine the attainment of the desired load current by sensing at least one accompanying switch-off of the second operating voltage during the second operating phase.

7. The circuit arrangement according to claim 1, wherein said adjustment device is configured to bring about a constant change in the second operating voltage, and wherein a sign of the change is determined by said monitoring device.

8. The circuit arrangement according to claim 1, which comprises further monitoring means for monitoring the second operating voltage with regard to exceeding an upper voltage limit.

9. A method for driving an inductive load, comprising:
   energizing the load by applying a first, relatively higher, operating voltage to the load during a first operating phase and applying a second, relatively lower, operating voltage in intermittent fashion to the load during a subsequent second operating phase;
   intermittently operating the energizing device during the second operating phase to set a desired load current by suitably switching on and switching off the second operating voltage at the load;
   monitoring an attainment of the desired load current during the second operating phase; and
   adjusting the second operating voltage based on a result obtained by the monitoring step.

10. The method according to claim 9, which comprises driving a magnetic valve of a fuel injection system of an internal combustion engine.

\* \* \* \* \*